(12) United States Patent
Dieudonne et al.

(10) Patent No.: US 11,796,582 B2
(45) Date of Patent: Oct. 24, 2023

(54) METHOD AND SYSTEM FOR MONITORING A MESHED CURRENT RETURN ELECTRICAL NETWORK FOR AN AIRCRAFT MADE OF COMPOSITE MATERIAL

(71) Applicants: SAFRAN ELECTRICAL & POWER, Blagnac (FR); CENTRE NATIONAL DE LA RECHERCHE SCIENTIFIQUE, Paris (FR); UNIVERSITE GRENOBLE ALPES, Saint Martin d'heres (FR)

(72) Inventors: Anca-Lucia Dieudonne, Blagnac (FR); Etienne Goddet, Lyons (FR); Nicolas Marie Henri Retiere, Fontaine (FR); Jean-Michel Guichon, Grenoble (FR)

(73) Assignees: SAFRAN ELECTRICAL & POWER, Blagnac (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 658 days.

(21) Appl. No.: 16/772,030

(22) PCT Filed: Dec. 12, 2018

(86) PCT No.: PCT/FR2018/053219
§ 371 (c)(1),
(2) Date: Dec. 15, 2020

(87) PCT Pub. No.: WO2019/115937
PCT Pub. Date: Jun. 20, 2019

(65) Prior Publication Data
US 2023/0143890 A1    May 11, 2023

(30) Foreign Application Priority Data

Dec. 13, 2017 (FR) ...................................... 1762093

(51) Int. Cl.
*G01R 31/00* (2006.01)
*B64F 5/60* (2017.01)

(52) U.S. Cl.
CPC .............. *G01R 31/008* (2013.01); *B64F 5/60* (2017.01); *B64D 2221/00* (2013.01)

(58) Field of Classification Search
CPC ...... G01R 31/008; B64F 5/60; B64D 2221/00
(Continued)

(56) References Cited

U.S. PATENT DOCUMENTS

2010/0127564 A1* 5/2010 Braden ................ H02G 13/00
307/9.1

FOREIGN PATENT DOCUMENTS

EP    2653859 A2    10/2013
FR    2997507 A1    5/2014

OTHER PUBLICATIONS

Zou, Liping et al., "The Application of Neural Network For Sneak Circuit Analysis On The Aircraft Electrical System", Prognostic And System Health Management Conference, May 24, 2011, pp. 1-5.
French Search Report FR1762093, dated Aug. 9, 2018 (2 pages).
International Search Report In PCT/FR2018/053219, dated Mar. 2, 2019 (11 pages).
(Continued)

*Primary Examiner* — Farhana A Hoque
(74) *Attorney, Agent, or Firm* — Bookoff McAndrews, PLLC

(57) ABSTRACT

The method for monitoring the electrical network comprises the identification of critical element(s) of the network, for at least one source-load pair that are connected to the network; the parametric estimation of a value of the electrical characteristic of each critical element, by using a numerical
(Continued)

model modelling an electrical behavior of the network as a function of said electrical characteristic and of electrical measurements performed by means of sensors positioned in the network, a sensor being positioned in the network for each critical element on at least one network element or on at least one network path formed by a plurality of network elements affected by a disturbance in the electrical characteristic of this critical element; the evaluation, for said at least one source-load pair and the determination of a state of the electrical network by taking into account the operational criterion.

11 Claims, 6 Drawing Sheets

(58) Field of Classification Search
 USPC .......................................................... 324/503
 See application file for complete search history.

(56) References Cited

OTHER PUBLICATIONS

Wächter, Andreas et al., "On The Implementation Of An Interior-Point Filter Line Search Algorithim For Large-Scale Nonlinear Programming", *Mathematical Subject Classification*, 2005, (33 pages).

\* cited by examiner

METHOD AND SYSTEM FOR MONITORING A MESHED CURRENT RETURN ELECTRICAL NETWORK FOR AN AIRCRAFT MADE OF COMPOSITE MATERIAL

CROSS-REFERENCE TO RELATED APPLICATIONS

This patent application is the U.S. National Phase Entry Under 35 U.S.C. § 371 of International Application No. PCT/FR2018/053219, filed on Dec. 12, 2018, which claims the benefit of priority to French Patent Application No. 1762093, filed on Dec. 13, 2017.

BACKGROUND OF THE INVENTION

The invention relates to the general field of aeronautics.

It relates more particularly to the monitoring of a current return network used by the electrical equipment on board an aircraft such as for example an airplane.

The electrical supply of electrical equipment on board the aircrafts (also known as "electrical loads") is traditionally ensured by an electrical source, connected to the apparatuses via a power cable, and by a current return network ensuring a low-impedance connection between the source and the electrical equipment of the aircraft. Such a low-impedance connection ensures a low-voltage drop between the electrical source and the various electrical loads on board the aircraft, and consequently fewer losses.

Traditionally, the current return function (as well as possibly other complementary functions such as for example metallization, protection against lightning impulse, protection against high-intensity radiated fields, potential reference, etc.) was inherently ensured by the fuselage and the metal structure of the aircrafts. However, in recent years, the aeronautics has seen the rise of composite materials which are increasingly used in the primary and secondary structures of the aircrafts. These composite materials have very good mechanical properties, but do not withstand the flow of currents or the overheating that these can generate.

It was therefore necessary to provide, for aircrafts made of composite materials, a complementary electrical network that allows ensuring, for the electrical equipment on board these aircrafts, the current return function. Examples of such networks are for example the ESN network (Electrical Structural Network) used by Airbus and the CRN network (Current Return Network) used by Boeing. These networks are low-impedance networks connected in parallel with the skin and the composite structure of the airplane and which make it possible to ensure the functions described above.

The CRN network is a network dedicated to the electrical functions mentioned above formed of interconnected profiled cables and bars, forming a meshed network. The ESN network is for its part a meshed and redundant network using elements combining both mechanical and electrical functionalities and forming part of the primary and secondary structure of the aircraft, cable and harness protections, braids, cables, etc.

The interconnection technologies currently used to connect the elements of the network together are not suitable for making reliable and viable electrical contacts. The verification of each contact, electrically, is also impossible in practice. The contact resistances at the interconnections of the network are consequently poorly controlled, depending on many parameters and are subject to change over time. Thus, in the example of a junction between two elements produced by means of bolts, the contact resistance depends in particular on the tightening force of the bolts, on the type of bolts, on the state of the surfaces, etc.

The ESN network is therefore presented as a large-size meshed network in which the flows of currents are driven by the contact resistances between the various structural elements of the network. It is therefore understood that it is necessary to monitor more particularly the state of the junctions of the ESN network making the interconnection between the various structural elements on which the network is based.

Document EP 2 653 859 describes a solution making it possible to monitor a flexible or electromechanical junction between two structural elements of an ESN network. This solution is based on the use of a current transformer mounted as a step-down transformer to inject, for the duration of the control, a high-intensity alternating current into an electrical conductor put in parallel with the junction to be controlled.

This solution is based on the assumption that the injected current largely passes through the junction desired to be monitored. However, most of the contact resistances at the junctions cannot be measured directly, because they are connected in parallel to the rest of the aircraft structure. A resistance measurement indeed gives the value of the desired contact resistance in parallel with the resistance of the rest of the network, without the possibility of discrimination between the two.

There is therefore a need for a monitoring method easy to implement and which makes it possible to effectively monitor the elements of a current return network in an aircraft, and more particularly the junctions used by this network for the interconnection of the structural elements of the aircraft on which it is based.

OBJECT AND SUMMARY OF THE INVENTION

The present invention responds in particular to this need by proposing a method for monitoring a meshed current return electrical network of an aircraft, said aircraft comprising at least one structure made of composite material, said electrical network comprising a plurality of conductive elements, said monitoring method comprising:

a step of identifying at least one critical element of the network, for at least one source-load pair comprising a source and a load of the aircraft that are connected to the network;

a step of parametrically estimating a value of the electrical characteristic of each critical element, this step using a numerical model modelling an electrical behavior of the network as a function of said electrical characteristic and of the electrical measurements performed by means of sensors positioned in the network and making it possible to evaluate said electrical behavior, a sensor being positioned in the network for each critical element on at least one element of the network or on at least one path of the network formed of a plurality of elements of the network affected by a disturbance in the electrical characteristic of this critical element;

a step of evaluating, for said at least one source-load pair, an operational criterion of the predefined network, this evaluation step using the value of the electrical characteristic estimated for each critical element; and a step of determining a state of the electrical network by taking into account the operational criterion evaluated for said at least one source-load pair.

Correlatively, the invention also relates to a system for monitoring a meshed current return electrical network of an aircraft, said aircraft comprising at least one structure made of composite material, said electrical network comprising a plurality of conductive elements, this monitoring system comprising:

- an identification device able to identify, for at least one source-load pair comprising a source and a load of the aircraft connected to the network, at least one critical element with regard to an operating state of the network (normal or degraded, or to a connectivity state) among the elements of the network;
- a plurality of sensors positioned in the network and able to perform electrical measurements;
- a parametric estimation module configured to estimate a value of the electrical characteristic of each critical element, this module using a numerical model modelling an electrical behavior of the network as a function of said electrical characteristic and of the electrical measurements performed by means of said sensors and making it possible to evaluate the electrical behavior, a sensor being positioned in the network for each critical element on at least one element of the network or on at least one path of the network formed by a plurality of elements of the network affected by a disturbance in the electrical characteristic of this critical element;
- an evaluation module configured to evaluate, for said at least one source-load pair, an operational criterion of the predefined network, this module using the value of the electrical characteristic estimated for each critical element; and
- a determination module configured to determine an operating state of the electrical network by taking into account the operational criterion evaluated for said at least one source-load pair considered.

The invention also relates to a method for identifying critical elements of a meshed current return electrical network of an aircraft, this aircraft comprising at least one structure made of composite material, the electrical network comprising a plurality of conductive elements. This identification method comprises:

- a step of modelling the electrical network by means of a graph comprising a plurality of nodes and a plurality of branches connecting these nodes, each node of the graph corresponding to a connection point between two elements of the network, each branch between two nodes representing an element of the network, said graph being represented by a matrix reflecting the topology of the network and comprising values of an electrical characteristic of the elements of the network represented by the branches of the graph;
- a step of determining the eigenvalues and eigenvectors of the matrix representing the graph;
- a step of estimating, from the eigenvectors and eigenvalues of the matrix, and for each element of a plurality of elements of the network represented by a branch of the graph, a sensitivity of a determined electrical property between a source and a load that are connected to the electrical network at a disturbance in the value of the electrical characteristic of this element; and
- a step of determining, among the elements of the network, critical elements with regard to a state of operation of the network, an element of the network being determined as critical when the sensitivity of the electrical property estimated for this element exceeds a predetermined criticality threshold.

The invention also relates to a device for identifying critical connection points in a meshed current return electrical network of an aircraft, said aircraft comprising at least one structure made of composite material, said electrical network comprising a plurality of conductive elements, said identification device comprising:

- a modelling module configured to model the electrical network by means of a graph comprising a plurality of nodes and a plurality of branches connecting these nodes, each node of the graph corresponding to a connection point between two elements of the network, each branch between two nodes representing an element of the network, said graph being represented by a matrix reflecting the topology of the network and comprising values of an electrical characteristic of the elements of the network represented by the branches of the graph;
- a determination module configured to determine the eigenvalues and eigenvectors of the matrix representing the graph;
- an estimation module configured to estimate, from the eigenvectors and eigenvalues of the matrix and for each element of the network represented by a branch of the graph, a sensitivity of an electrical property determined between a source and a load that are connected to the electrical network at a disturbance in the value of the electrical characteristic of this element; and
- a determination module configured to determine, among the elements of the network, critical elements with regard to an operating state of the network, an element being determined as critical when the sensitivity of the electrical property estimated for this element exceeds a predetermined criticality threshold.

The identification method (respectively device) according to the invention is preferably used by the monitoring method (respectively system) to identify the critical elements of the current return electrical network.

The invention proposes a method that allows efficiently and simply monitoring a current return network on board an aircraft.

This method is based on a prior identification of the critical elements of the network which are likely in particular to affect the connectivity of the network and its capacity to fulfill the functions for which it has been dimensioned. In this way, it is possible to simplify the monitoring of the network by being limited to the monitoring of these critical elements.

The identification of the critical elements proposed by the invention has a controlled complexity: it is based on a representation of the current return network by a graph, particularly well adapted for such a network, and requires a single numerical calculation consisting in determining the spectrum of the matrix representing the graph (i.e. its eigenvalues and its eigenvectors). From the eigenvalues and eigenvectors of the matrix representing the graph, it is then possible, via a simple disturbing study of these eigenvalues and these eigenvectors, to deduce therefrom the critical elements of the network that are to be monitored more particularly to ensure the normal operation thereof. These critical elements are identified by observing the sensitivity of an electrical property of the network (for example a voltage or intensity drop in the network) at variations (disturbances) in the electrical characteristics of the elements of the network. Particularly, if this sensitivity exceeds a predetermined threshold during a disturbance applied to a given element, this element is considered to be critical, because the variations in its electrical characteristics are likely to cause a network failure.

In a preferred embodiment:

the electrical characteristic considered is an admittance of the element of the network;

the matrix of the graph is a Laplacian matrix; and the electrical property is an electrical voltage between the source and the load considered (or a voltage drop between these two elements).

It should be noted that the modelling in the form of a graph, as well as the spectral decomposition on which the invention is based and the disturbing study of the spectrum of the matrix of the graph applied by the invention advantageously make it possible to obtain direct analytical relationships between the disturbances applied to the electrical characteristics of the elements of the network and of the components of the spectrum of the graph, to then determine the sensitivity of said electrical properties of the network against the disturbances. This results in a substantial time saving compared to the conventional methods using circuit calculations and a reduced complexity of the invention.

The identification of the critical elements of the network allows simplifying the monitoring of the network, focusing on the critical elements. The monitoring proposed by the invention allows verifying the connectivity of the electrical loads on board the aircraft and the compliance with operational criteria imposed on the network.

This operational criterion is for example a maximum value of a voltage drop observed between each source and each load, the state of the electrical network being determined as satisfactory (or normal) if this voltage drop is, for each source-load pair, less than said maximum value.

Another operational criterion can be a variation observed between the electrical characteristic estimated for a critical element and a nominal value of this electrical characteristic, the state of the electrical network being determined as faulty if for at least one critical element of the network for at least one source-load pair, this variation is greater than a predetermined alert threshold.

Of course, other operational criteria can be considered.

The invention thus makes it possible to easily detect the degradations of elements of the current return network. It also makes it possible to easily locate the degraded elements and facilitate maintenance operations on the network.

In a particular embodiment, the monitoring method further comprises a preliminary step of selecting, from a plurality of loads of the aircraft that are connected to the electrical network, at least one load considered to be essential with regard to the operation of the aircraft, the identification, parametric estimation, and evaluation steps being applied only to the source-load pairs comprising said at least one selected essential load.

This preliminary selection allows reducing the complexity of the implemented monitoring. It has indeed an impact on the number of critical elements considered during monitoring, which depends on the electrical loads taken into account.

In a particular embodiment, during the parametric estimation step, there are as many sensors used as identified critical elements, each sensor being associated with a critical element and placed on the network element or on the network path most affected by a disturbance in the value of the electrical characteristic of this critical element.

This makes it possible to limit the measurements necessary to estimate the technical characteristics of the critical elements during monitoring. In this embodiment, it is ensured to have relevant measurements to reliably evaluate these technical characteristics while limiting the complexity linked to the implementation of these measurements. The inventors have found, through tests, that this embodiment leads to a good compromise between complexity and reliability of the monitoring carried out, and makes it possible to optimize the positioning of the sensors in the network.

Of course, it is possible to use more sensors and make more measurements to improve the accuracy of the monitoring.

In a particular embodiment, the parametric estimation step implements a technique of optimization known as technique of optimization of the interior points on a plurality of iterations.

Such a technique is particularly effective when many parameters have to be optimized. However, other optimization techniques can be used as a variant.

In another embodiment, the monitoring method comprises a prior step of initially characterizing the electrical characteristics from the graph modelling the network, from the matrix representing the graph and from electrical measurements performed in the network.

Thus, the modelling proposed by the invention also allows the initial characterization of the current return electrical network and particularly of the electrical characteristics of its critical elements (contact resistances).

BRIEF DESCRIPTION OF THE DRAWINGS

Other characteristics and advantages of the present invention will emerge from the description given below, with reference to the appended drawings which illustrate an exemplary embodiment thereof devoid of any limiting character. In the figures.

DETAILED DESCRIPTION OF THE INVENTION

Figure 1:
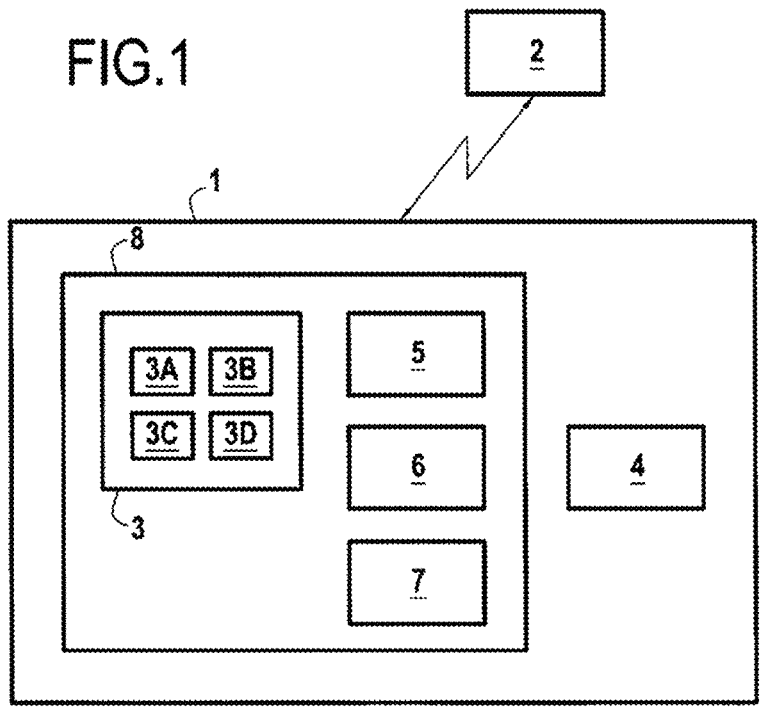
FIG. 1 represents, in its environment, a system for monitoring a current return electrical network according to the invention.

FIG. 1 represents, in its environment, a monitoring system 1 of a meshed electrical network 2 of an aircraft, according to the invention in a particular embodiment.

In the example considered here, the aircraft is an airplane comprising inner or outer structures made of composite materials. By way of illustration, it is considered here that the fuselage of the airplane is made of composite material, possibly comprising a metal layer (metal mesh on the surface of the composite materials). The fuselage is connected to the other conductive elements of the network by bolts or rivets (which are also conductive elements).

The electrical network 2 considered is a current return network used on board the airplane. Such an electrical network ensures, in a manner known per se, the return of the operational currents of the various electrical loads to the various electrical sources of the airplane, but can also fulfill one or more of the following functions:
- metallization and protection against the electrical faults;
- protection against the indirect effects of the lightning;
- protection against the high-intensity radiated fields:
- potential reference for the equipment and the electronics on board the airplane; and
- protection of the people on board.

It should be noted that a power supply network of an airplane includes several electrical sources (e.g. voltage sources): at least one electrical generator per engine, an auxiliary electrical generator (APU—Auxiliary Power Unit), batteries, a generator associated with a turbine deployed in case of emergency (RAT—Ram Air Turbine). In the long term, other electrical sources of energy could be considered (fuel cells, generators at the end of the wing, etc.).

For the sake of simplification in the remainder of the description, a single electrical source and several loads in the aircraft are considered.

In the example considered here, the electrical network 2 is an ESN network (Electrical Structural Network) as described for example in document EP 2 653 859 previously mentioned. It concerns a low-impedance network, connected in parallel with the fuselage made of composite material of the airplane, and connecting the various electrical loads of the airplane to the various electrical sources. A low-impedance connection advantageously ensures a low voltage drop (i.e. difference) between each load and each power source of the airplane, and therefore fewer losses.

The electrical network 2 is meshed and redundant, each element of the electrical network being connected to at least two other elements of the network in order to comply in particular with the existing safety standards. It is based on the metal components of the airplane and comprises a plurality of conductive elements of different kinds, namely structural elements constituted in particular of metal frames, metal crossbars, metal seat tracks, cab floor, etc., as well as any other conductive element connected in parallel, such as metal cable trays (raceways), electromagnetic protections, braids, cables or bars, or any junction element achieving the interconnection or the connection between these different elements. The junctions between the various conductive elements of the electrical network 2 are made by fastening elements such as rivets, bolts or screws. The contacts between the elements of the electrical network 2 can consequently be complex contacts, made using several rivets, bolts or screws, or simple contacts, made using only one rivet, bolt or screw. The complex contacts generally concern the electromechanical connections between structural elements of the electrical network 2, while the simple contacts are generally made between the other elements of the network or between the other elements of the network and of the structural elements.

It should be noted that the segments of conductive elements of the network defined on either side, where appropriate of the various junctions themselves constitute conductive elements of the network within the meaning of the invention.

Whatever the junction considered between two elements of the network (structural or not), a contact resistance appears at the level of the contact. The resistances induced by these electrical contacts are not insignificant and impact the current flows in the electrical network 2 and its state of connectivity.

In the example considered here, to facilitate understanding of the invention, attention is paid only to the return of the direct currents which is ensured by the electrical network 2. The electrical network 2 is assumed here to be a resistive electrical network, each element of the network being able to be assimilated to an admittance (defined as the inverse of the impedance). As the direct current has been assumed, the inductive and capacitive parts of the impedance are zero, therefore the impedance is equal to the resistance and consequently, the admittance is the inverse of the resistance.

However, these assumptions are not limiting per se and the invention of course applies to other types of networks, and to other electrical characteristics making it possible to characterize the elements of the network. Thus, taking into account the alternating or pulse currents can be considered. This implies a frequency calculation, therefore this implies taking into account the inductances and capacities of the elements of the network, as well as inductive and capacitive couplings between the different elements of the network. Taking into account the frequency aspects complicates the models, but does not change the approach presented in this study.

The monitoring system 1 is advantageously able to monitor and determine the state of the electrical network 2 when it is operating or excited by judiciously chosen currents. By state of the network is meant here its operating state (for example, normal/satisfactory state or faulty state) and its capacity to ensure the primary functions for which it is provided and sized, and more particularly its function of return of the direct current between the loads and the electrical sources of the aircraft. This state is evaluated by the monitoring system 1 with regard to a predefined operational criterion representative of the operation of the network (normal or degraded and/or of its state of connectivity). In the example considered here, the operational criterion considered is a maximum voltage drop between the sources and the loads of the aircraft: in other words, all of the voltage drops observed between each source and each load of the aircraft must be less than a predetermined maximum value. The operational criterion is considered here to be met (and the state of the network is considered to be satisfactory) if this maximum voltage drop is less than the maximum voltage drop imposed by the system of higher order. By system of higher order is meant any electrical system using all or part of the electrical network 2 to ensure the correct operation of electrical equipment under normal operating mode or under degraded mode. In the remainder of the description, by way of illustration, a maximum voltage drop of 0.5 V is considered.

Of course, other operational criteria can be considered as a variant by the monitoring system 1 to assess the state of the electrical network 2, such as for example an operational criterion relating to a current intensity, on a variation of the contact resistances within the network, etc.

In order to monitor the state of the electrical network 2, the monitoring system 1 is based on various entities. More specifically, it comprises:
- an identification device 3, according to the invention, able to identify among the various elements of the network 2, one or more elements called critical elements. By critical element is meant here an element likely to greatly degrade the connectivity of the loads of the aircraft in the event of malfunction or degradation. In the example considered here, it is considered that the critical elements of the electrical network 2 are located at the level of the contacts ensured by the junctions of the electrical network 2, and not at the level of the structural elements of the network strictly speaking which are considered to be reliable. The identification of these critical elements allows simplifying the monitoring of the network 2, which is then limited to the monitoring of these critical elements;

a plurality of sensors 4 positioned in the electrical network 2 that allow performing electrical measurements. Such sensors are for example (electric or magnetic) field, current, voltage, etc. sensors. conventionally used to perform electrical measurements; and a plurality of modules including in particular:
- a parametric estimation module 5: this module is configured to estimate the values of the electrical characteristics of the critical elements. There is an interest here in the values of the admittances of the critical elements. The parametric estimation module 5 uses for this purpose, as detailed later, a numerical model modelling the electrical behavior of the network 2 as a function of the admittances of its elements and, of the electrical measurements performed by means of the sensors 4 duly positioned in the network to allow the evaluation of the electrical behavior of the latter when it is in normal operation, in degraded mode or supplied on a precise pattern;
- an evaluation module 6: this module is configured to evaluate for different source-load pairs, the operational criterion to which attention is paid to determine the state of the network (maximum voltage drop less than 0.5 V here). It uses to this end the values of the electrical characteristics of the critical elements estimated by the estimation module 5; and
- a determination module 7: this module is configured to determine a state of the electrical network 2 taking into account the operational criterion evaluated by the evaluation module 6 over all of the source-load pairs considered.

The functions of the modules 5-7 of the monitoring system are explained in more detail later.

In the embodiment described here, the modules 5-7 are software modules defined by instructions from one or more computer programs stored in the read-only memory of a computer 8, and readable by a processor of this computer. This computer can be installed, for example on board the aircraft.

In the embodiment described here, the identification device 3 according to the invention is also integrated into the computer 8 and is based on the hardware means of this computer. According to the invention, the identification device 3 comprises various software modules here, defined by computer program instructions readable by the processor of the computer 8 and stored in its read-only memory. These instructions, when read by the processor of computer 8, lead to the execution of an identification method according to the invention.

The various modules of the identification device 3 comprise in particular:
- a modelling module 3A: this module is configured to model the electrical network 2 by means of a graph G comprising a plurality of nodes and a plurality of branches connecting these nodes. As further detailed below, each node of the graph corresponds to a connection point between two elements of the network: it can concern a connection point between two structural elements of the network or between a structural element of the network and a junction used to connect this structural element to another structural element of the network, etc. Each branch between two nodes therefore represents an element of the network, whether it concerns a structural element (or a segment of a structural element of the network), a junction ensuring a connection between two structural elements or any other conductive element of the network. The graph is represented by a matrix reflecting the topology of the network and comprising values of an electrical characteristic of the elements of the network represented by the branches of the graph. The graph G is represented, at the level of the modelling module 3A, by a matrix denoted in the following "L" reflecting the topology of the network 2 (that is to say its conductive elements and the interconnections between its various conductive elements), and comprises the values of electrical characteristics of the elements of the network, namely here the values of their admittances;
- a determination module 3B: this module is configured to determine the eigenvalues and eigenvectors of the matrix L;
- an estimation module 3C: this module is configured to estimate, from the eigenvectors and eigenvalues of the matrix L, and for each element of a plurality of elements of the network represented by a branch of the graph, the sensitivity of an electrical property of the network determined between a source and a load of the aircraft at a disturbance in the value of the electrical characteristic comprised in the matrix L of this element. By sensitivity of an electrical property is meant here a variation of this electrical property in response to the disturbances applied to the electrical characteristics of the elements of the network. In the example considered here, the disturbed electrical characteristic is the admittance of each element and the electrical property in question is a voltage between the source and the load (designated in the following of the description given the context by voltage "drop" between the source and the load). It is chosen in conjunction with the operational criterion on which the monitoring system focuses to determine the state of the network 2 (namely here the maximum voltage drop between all the sources and loads of the aircraft). However, as a variant, other properties can be estimated (for example an intensity, a resistance between the source and the load, etc.); and
- a 3D determination module: this module is configured to determine among the elements of the network 2, critical elements with regard to the electrical property considered (voltage here) for the source and the load of interest. The 3D determination module identifies an element as critical when the sensitivity to the disturbance applied to the value of the admittance of this element exceeds a predetermined criticality threshold denoted "THR". Such a critical element is indeed likely to greatly degrade the connectivity of the loads of the aircraft in the event of malfunction or degradation. In the example considered here, THR=2% of the maximum allowable voltage drop (0.5 V here).

The functions of the various modules of the identification device 3 are described in more detail now with reference to the steps of the identification method according to the invention.

As mentioned previously, the invention offers an effective solution allowing the monitoring of the state of an electrical network 2. This monitoring aims at verifying the compliance, by the electrical network 2, with a predefined operational criterion of the network. As indicated previously, in the example considered here, the operational criterion is considered to be met (and the state of the network is considered normal or satisfactory by the monitoring system 1) if the maximum voltage drop at the terminals of all source-load pairs of the aircraft is less than a maximum voltage drop taken equal to 0.5 V during the normal operation of the network 2.

The monitoring implemented by the invention advantageously focuses on a limited number of elements of the network 2, namely on the elements identified as critical by the identification device 3 for each source-load pair of the aircraft considered during monitoring. Indeed, as indicated above, these critical elements are the elements of the network 2 that are likely to degrade the connectivity of the loads of the aircraft most strongly in the event of malfunction or degradation, and therefore that risk making the current return electrical network 2 non-operational. The identification of these critical elements allows simplifying the monitoring of the network 2.

Figure 2:
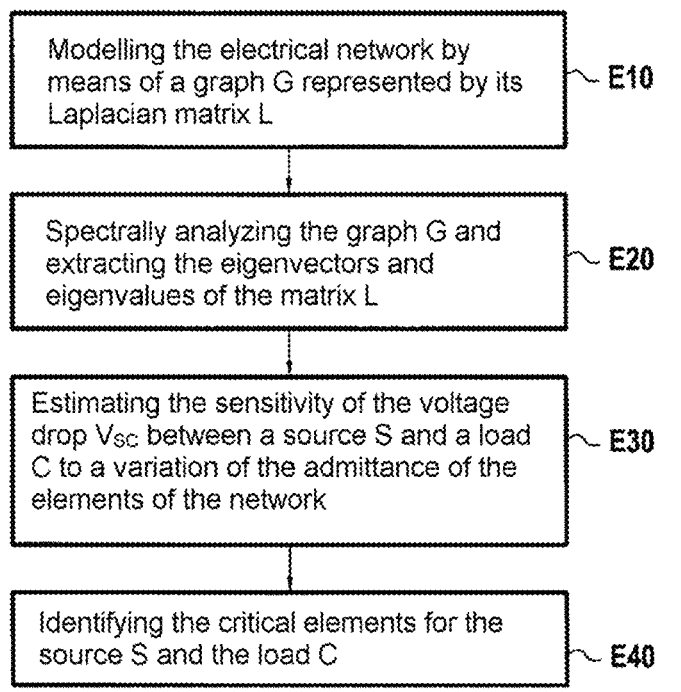
FIG. 2 represents, in the form of a flowchart, the main steps of a method for identifying critical elements of the current return network, according to the invention, as implemented by the monitoring system of FIG. 1.

There will be described, with reference to FIG. 2, the main steps implemented by the identification device 3 to identify these critical elements of the network 2. These critical elements can vary from one load to another. They are therefore identified for each load of the aircraft considered during the monitoring of the current return electrical network.

To better understand the principle of the invention, the following sometimes details the assumptions and mathematical developments on which the inventors have relied to configure the identification device 3 with a view to identifying the critical elements of the network 2.

According to the invention, to identify the critical elements of the network 2, the identification device 3 is based on a numerical modelling of the electrical network. More specifically, the identification device 3, via its modelling module 3A, models the electrical network 2 by means of a complex graph G (step E10).

As known, a graph is composed of a set of nodes linked by branches (or links). The use of a graph to model a meshed network such as the electrical network 2 is therefore particularly well adapted.

Each node of the complex graph G corresponds to a connection point between two conductive elements of the electrical network 2. Each branch of the graph represents a conductive element of the electrical network 2 (structural element, segment of structural element or any other conductive element forming part of the electrical network 2). Each connection (junction) requiring at least one screw is represented by two nodes in the graph, having the same coordinates, and a branch of length 0 and of weight equal to the value of the equivalent contact resistance.

Figure 3A:
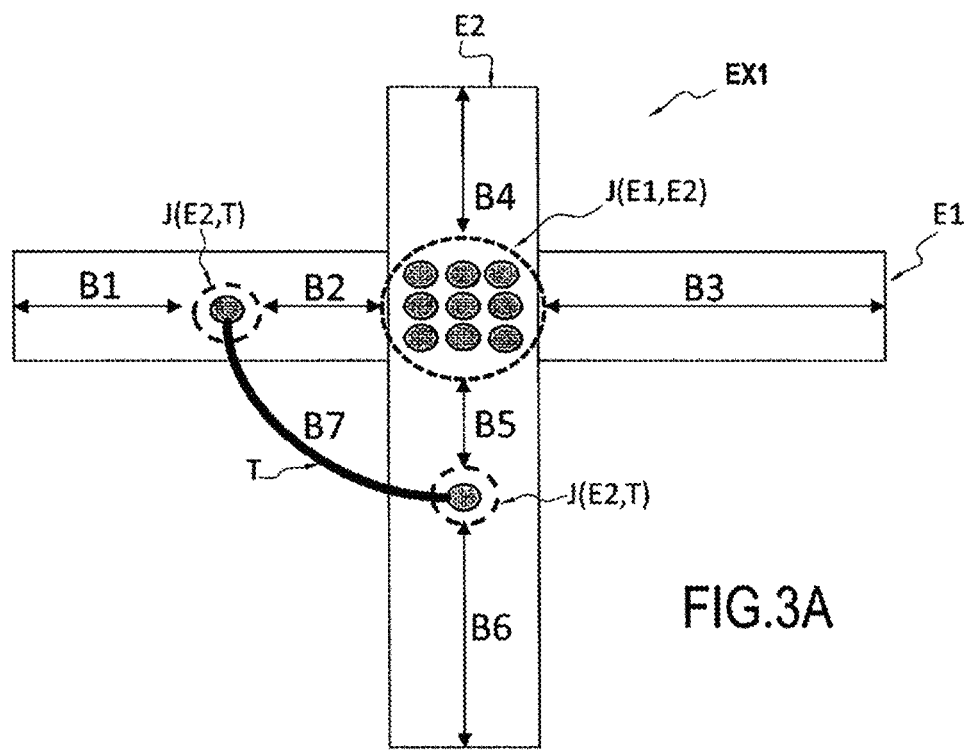
FIGS. 3A and 3B illustrate a first example of a network and its representation by a graph which can be used during the identification method represented in FIG. 2.
Figure 3B:
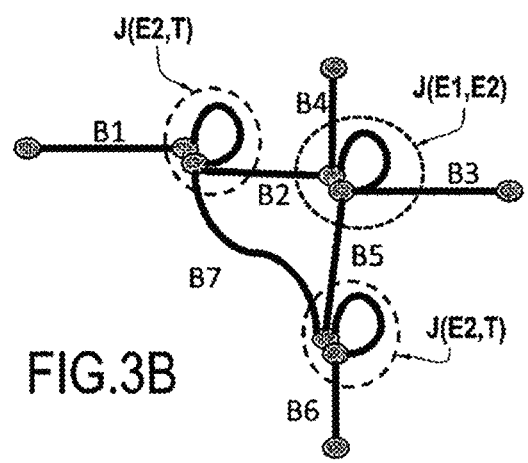

By way of illustration, to better understand how such a graph G is constructed, FIGS. 3A and 3B represent respectively a portion of electrical network EX1 and the complex graph G(EX1) modelling this portion of electrical network.

More specifically, FIG. 3A represents different conductive elements of the network EX1 comprising in particular two structural elements E1 and E2 and a braid T. Various connection points exist between these conductive elements and are characterized by a junction J(E1,T) between the structural element E1 and the braid T, a junction J(E2,T) between the structural element E2 and T, and a junction J(E1,E2) between the two structural elements J1 and J2. It is assumed that these junctions are made for example by means of a screw. "Segments" designate the portions of the structural elements located on either side of these junctions. Thus, each of the structural elements E1 and E2 is respectively composed of several segments, namely segments B1, B2 and B3 for the element E1, and segments B4, B5 and B6 for the element E2. It is noted that each segment itself constitutes a conductive element of the network within the meaning of the invention.

FIG. 3B represents the graph G(EX1) modelling the portion of electrical network EX1 illustrated in FIG. 3A. As mentioned previously, each connection requiring at least one screw is represented by 2 nodes in the graph, having the same coordinates, and a branch of length 0 and of weight equal to the value of the equivalent contact resistance. Thus, whether it is a connection between a structural element and a braid (such as the junctions J(E1,T) and J(E2,T) or any other conductive element of the electrical network 2, or a connection between two structural elements (such as the junction J(E1,E2)), the connection "points" are represented in the same way. The branches of the graph correspond either to elements of the network, or to segments of the network (as in the example illustrated in FIG. 3B). The weights of the branches of the network (B1 to B7 by way of example) which are not contact resistances are equal to the values of the resistances of the segments of the respective elements.

In this way, the complex graph G models not only the interconnection of the structural elements and of the other conductive elements connected in parallel on which the network is based, but also the contacts established at each connection point between these different elements.

Figure 4A:
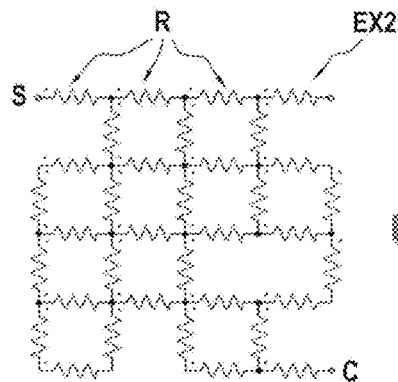
FIGS. 4A and 4B illustrate a second example of a network and its representation by a graph which can be used during the identification method represented in FIG. 2.
Figure 4B:
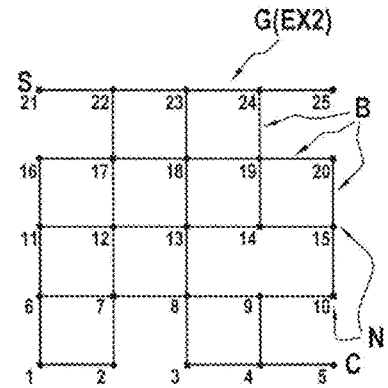

Another example is illustrated in FIGS. 4A and 4B.

FIG. 4B represents a complex graph G(EX2) modelling the resistive electrical network EX2 represented in FIG. 4A. The electrical network EX2 comprises 35 identical resistances R which are modeled by 35 branches B on the graph G(EX2) connecting together 25 nodes. The 25 nodes N of the graph G(EX2) represent the interconnections between the resistances R of the electrical network 2ex. Each branch of the graph G(EX2) is characterized by an admittance.

The graph G can be represented by a matrix L reflecting the topology of the electrical network 2 as well as the electrical characteristics of its elements. The example considered here as mentioned above, focuses, as electrical characteristics, on the admittances of the elements of the network 2. Each branch of the graph G is therefore associated with an admittance whether it concerns an admittance associated with a structural element of the network (in this case equal to the inverse of its impedance, that is to say in the resistive example considered here, to the inverse of its resistance), or an admittance corresponding to a contact resistance at a junction.

The matrix L used by the modelling module 3A to represent the graph G is here the Laplacian matrix of the graph G modelling the electrical network 2. The components $L(u,v)$ of this matrix of dimensions n×n where n designates the number of nodes of the graph G are defined by, for u and v designating nodes of the graph:

$$L(u, v) = \begin{cases} -y_{uv} & \text{if } u \text{ and } v \text{ are adjacent} \\ \sum_{t \in nei(u)} y_{ut} & \text{if } u = v, \\ 0 & \text{otherwise} \end{cases}$$

where $y_{uv}$ designates the admittance associated with the branch connecting the nodes u and v, and nei(u) designates the set of the neighboring nodes of the graph G directly connected to the node u.

As a variant, another matrix representing the graph G can be considered, such as for example an adjacency matrix.

Following this modelling, the determination module 3B of the identification device 3 performs a spectral analysis of the graph G and in particular of its Laplacian matrix L. This spectral analysis consists in extracting the eigenvalues and eigenvectors from the Laplacian matrix L (step E20). The eigenvalues and eigenvectors of the L matrix are also known as spectrum of the Laplacian matrix L.

To determine the spectrum of the Laplacian matrix L, the determination module 3B uses techniques of diagonalization of the matrix L known per se and not described in detail here.

In a known manner, the n eigenvalues $\theta=(\theta_1, \theta_2, \ldots, \theta_n)$ of the Laplacian matrix L of dimensions n×n are the n roots of the characteristic polynomial:

$$\det(L-\theta*J)=0$$

where J designates the identity matrix, and det the determinant. The Laplacian matrix being symmetric and positive semi-definite, all its eigenvalues are actual and positive. It is also noted that the Laplacian matrix of a graph has at least one eigenvalue equal to 0, the multiplicity of this zero eigenvalue being equal to the number of nodes forming connected clusters in the graph.

In the following description, it is assumed that the eigenvalues of the matrix L verify:

$$\theta_1=0 \leq \theta_2 \leq \ldots \leq \theta_n$$

The right $\psi_i$, and left $\phi_i$ eigenvectors associated with the it h eigenvalue are defined by:

$$L\psi_i=\theta_i\psi_i \text{ and } \phi_i L=\theta_i\phi_i$$

Only the right eigenvectors are used in the remainder of the description. The following notation is used here, to designate the matrix grouping the right eigenvectors of the matrix L together:

$$\Psi=[\psi_1 \; \psi_2 \ldots \psi_n]$$

It is further assumed that the right eigenvectors are orthogonal together, namely:

$$\psi_i^t \cdot \psi_j=0 \text{ if } i \neq j, i=1 \ldots n, j=1, \ldots, n$$

and that they are standardized namely:

$$\psi_i^t \cdot \psi_i=1$$

which involves that $\Psi^n\Psi=J$.

These properties are also valid for the left eigenvectors.

The spectrum of the Laplacian matrix L is then used by the estimation module 3C of the identification device 3 to estimate for each element of a plurality of elements of the network represented by a branch of the graph G, the sensitivity of an electrical property determined between a source and a load connected to the electrical network, at a disturbance in the value of the electrical characteristic of this element of the network (step E30).

In the embodiment described here, the estimation module 3C considers more particularly as the electrical property of the network, the voltage (or voltage drop) $V_{SC}$ between a source S and a load C of a source-load pair of the aircraft connected to the electrical network 2, when it is operational.

To determine the equations applied by the 3C estimation module to estimate the sensitivity of the voltage $V_{SC}$, the inventors conducted the following reasoning.

The Laplacian matrix L representing the graph of the electrical network 2 can be written in the form:

$$L=\Psi\Delta\Psi^t$$

where $\Delta$ designates the diagonal matrix containing the eigenvalues of L.

Furthermore, by definition, the Laplacian matrix L connects the electrical potentials denoted $\underline{V}=(V_1, \ldots, V_n)$ and the nodal currents denoted $\underline{I}=(I_1, \ldots, I_n)$ of the graph G (i.e. considered at each node of the graph) via the relationship:

$$L\underline{V}=\underline{I}$$

It follows that:

$$\underline{V}=\Psi\Delta^*\Psi^t\underline{I}$$

where $\Delta\cdot$ designates the Moore-Penrose pseudo-inverse matrix of $\Delta$.

Since the matrix $\Delta$ is not invertible, a mathematical relationship of regularization between the nodal potentials $V_t$ is also considered here, namely:

$$\Sigma_i V_i=0$$

The electrical potential $V_i$ of a node i can thus be written:

$$V_i = \sum_{j=1}^{n}\left(\sum_{k=2}^{n} \frac{\psi_k(i)\psi_k(j)}{\theta_k}\right) I_j \qquad \text{Eq.1}$$

In addition, if an electrical current source S and a load C of the aircraft connected to the electrical network 2 is considered, the resistance between the source S and the load C when a current $I0$ is transited therebetween is:

$$R_{SC} = \frac{V_S - V_C}{I_0}$$

where $V_S$ designates the potential of the source S and $V_C$ designates the potential of the load C. By replacing $V_S$ and $V_C$ with the decomposition indicated in the equation (Eq. 1) provided above, there is:

$$R_{sc} = \frac{1}{I_0}\left(\sum_{j=1}^{n}\left(\sum_{k=2}^{n}\frac{\psi_k(s)\psi_k(j)}{\theta_k}\right)I_j - \sum_{j=1}^{n}\left(\sum_{k=2}^{n}\frac{\psi_k(c)\psi_k(j)}{\theta_k}\right)I_j\right)$$

By assuming that all the nodal currents are zero except those of the nodes S and C and that:

$$I_s=-I_c=I_0$$

there is for the resistance $R_{SC}$:

$$R_{sc} = \frac{I_s}{I_0}\left(\sum_{k=2}^{n}\frac{\psi_k(s)^2 - 2\psi_k(s)\psi_k(c) + \psi_k(c)^2}{\theta_k}\right) \qquad \text{Eq.2}$$
$$= \sum_{k=2}^{n}\frac{(\psi_k(s) - \psi_k(c))^2}{\theta_k}$$

It therefore appears, with regard to the equations (Eq. 1) (by replacing in the equation the node i with the source S and with the load C respectively) and (Eq. 2), that the voltage $V_{SC}=V_S-V_C$ between the source S and the load C and the electrical resistance $R_{SC}$ between these two nodes can be determined from the spectrum of the matrix L. The inventors therefore had the judicious idea of carrying out a disturbing study of the spectrum of the matrix L with a view to predicting the variations in the electrical properties of the electrical network 2 (namely in particular here the voltage $V_{SC}$), when disturbances are applied to the components of the Laplacian matrix L of the graph G modelling the electrical network 2. These disturbances are linked to the modification of the structure of the network 2 (for example due to a degradation of contact between two structural elements of the network). It is assumed here that the disturbances in the Laplacian matrix are weak enough to remain in the linear domain.

In the remainder of the description, L0 designates the Laplacian matrix of the graph G before application of the disturbances (L0 corresponds to the matrix L considered in step E20 described above). All the notations relating to this matrix introduced previously (for example to designate the eigenvalues and eigenvectors of the matrix) are preserved and indexed by 0.

The equation connecting the $i^{th}$ eigenvalue and eigenvector of the Laplacian matrix L0 is:

$$L_0 \psi_{0i} = \theta_{0i} \psi_{0i}$$

When the network 2 is disturbed (for example if a branch impedance is increased due to the deterioration of the connection between the two nodes connected by the branch), the Laplacian matrix representing the network 2 as well as its spectrum are modified. "L" designates in the following the Laplacian matrix characterizing the electrical network 2 after disturbance.

The relationship between the $i^{th}$ eigenvalue and eigenvector of the disturbed Laplacian matrix L is:

$$L\psi_i = \theta_i \psi_i$$

If the disturbance is weak, it is possible to calculate the eigenvalues and eigenvectors of the Laplacian matrix L of the disturbed network from the spectrum of the initial Laplacian matrix L0, by linearizing the relationship indicated above. $\Delta L$, $\Delta \psi i$ and $\Delta \theta i$ designate the respective variations applied to the matrix L0, and to the right eigenvectors $\psi i$ and to the eigenvalues $\theta i$ when the network 2 is disturbed.

More particularly, it can be demonstrated that the eigenvalues $\theta i$ and the eigenvectors $\psi i$ of the disturbed Laplacian matrix L can be written in the following form:

$$\theta_i = \theta_{i0} + \psi_{0i}^t \Delta L \psi_{0i}$$

$$\psi_i = \psi_{0i} + \sum_{k \neq i}^{n} \frac{\psi_{0k}^t \Delta L \psi_{0i}}{\theta_{0i} - \theta_{0k}} \psi_{0k}$$

These equations have been used judiciously by the inventors to determine the relationships applied by the estimation module 3C of the identification device 3 to estimate the sensitivity of the nodal potentials Vi to a modification of the admittance of a branch of the graph. It concerns, by calculating this sensitivity between the source S and the load C considered for different branches of the graph G (or in an equivalent manner, for different elements of the network 2), determining the branches that lead, when their admittance is disturbed, to an increased sensitivity (i.e. greater than a predetermined threshold). These branches designate the critical elements of the network 2 to which particular attention should be paid upon determination of the state of the network 2.

More specifically, when a non-zero admittance $\Delta y_{uv}$ is added to the admittance of any branch connecting nodes u and v, the result is a modification $\Delta L$ of the Laplacian matrix verifying:

$$\Delta L = \begin{pmatrix} 0 & \cdots & 0 & \cdots & 0 \\ \vdots & \Delta y_{uv} & \vdots & -\Delta y_{uv} & \vdots \\ 0 & \cdots & 0 & \cdots & 0 \\ \vdots & -\Delta y_{uv} & \vdots & \Delta y_{uv} & \vdots \\ 0 & \cdots & 0 & \cdots & 0 \end{pmatrix}$$

(the non-zero components $+/-\Delta y_{uv}$ correspond to the components located at the intersection of the $u^{th}$ row and the $v^{th}$ column).

The eigenvalues of the Laplacian matrix L0 are then modified in the following way:

$$\theta_i = \theta_{0i} + (\Delta y_{uv}(\psi_{0i}(u) - \psi_{0i}(v))^2)$$

It follows from this relationship that the sensitivity (i.e. variation in response to the disturbance $\Delta y_{uv}$ applied to the branch connecting the nodes u and v) of the eigenvalues of the Laplacian matrix to the modification of the admittance of the branch between the nodes u and v is:

$$\frac{\partial \theta_i}{\partial y_{uv}} = (\psi_{0i}(u) - \psi_{0i}(v))^2 \qquad \text{q.3}$$

Similarly, the eigenvectors of the disturbed network verify the following relationship:

$$\psi_i = \psi_{0i} + \Delta y_{uv} \sum_{k \neq i}^{n} \left[ \left( \frac{\psi_{0i}(u)(\psi_{0k}(u) - \psi_{0k}(v))}{\theta_{0i} - \theta_{0k}} + \frac{\psi_{0i}(v)(\psi_{0k}(v) - \psi_{0k})}{\theta_{0i} - \theta_{0k}} \right) \psi_{0k} \right]$$

The sensitivity of the eigenvectors of the Laplacian matrix to the modification of the admittance of the branch between the nodes u and v is therefore given by:

$$\frac{\partial \psi_i}{\partial y_{uv}} = \sum_{k \neq i}^{n} \left[ \left( \frac{\psi_{0i}(u)(\psi_{0k}(u) - \psi_{0k}(v))}{\theta_{0i} - \theta_{0k}} + \frac{\psi_{0i}(v)(\psi_{0k}(v) - \psi_{0k})}{\theta_{0i} - \theta_{0k}} \right) \psi_{0k} \right] \qquad \text{q.4}$$

In the embodiment described here, the identification device 3 uses the sensitivities of the eigenvalues and eigenvectors of the Laplacian matrix of the graph G given respectively by the equations (Eq. 3) and (Eq. 4) to determine the sensitivity of the voltage between the considered source S and load C to the variation of the admittance of each branch of the graph.

More precisely, the electrical potential $V_{0i}$ of the node i before disturbances is written:

$$V_{0i} = \sum_{j=1}^{n} \left( \sum_{k=2}^{n} \frac{\psi_{0k}(i)\psi_{0k}(j)}{\theta_{0k}} \right) I_j$$

where Ij designates the nodal intensity at node j. After a small variation of the Laplacian matrix, this electrical potential becomes:

$$V_i = \sum_{j=1}^{n}\left(\sum_{k=2}^{n}\frac{\psi_k(i)\psi_k(j)}{\theta_k}\right)I_j$$

where $V_i = V_{0i} + \Delta V_i$, $\psi_i = \psi_{i0} + \Delta\psi_i$ and $\theta_i = \theta_{i0} + \Delta\theta_i$.

The modification of the electrical potential resulting from a small disturbance applied to an admittance is therefore:

$$\Delta V_i = \sum_{j=1}^{n} I_j\left[\sum_{k=2}^{n}\left(\frac{(\psi_{0k}(i)+\Delta\psi_k(i))(\psi_{0k}(j))}{\theta_{0k}+\Delta\theta_k} + \frac{\Delta\psi_k(j)}{\theta_{0k}+\Delta\theta_k} - \frac{\psi_{0k}(i)\psi_{0k}(j)}{\theta_{0k}}\right)\right]$$

namely, by neglecting the second-order terms:

$$\Delta V_i = \sum_{j=1}^{n} I_j\left[\sum_{k=2}^{n}\left(\frac{(\Delta\psi_k(i)\psi_{0k}(j)+\Delta\psi_k(j)\psi_{0k}(i))}{(\theta_{0k}+\Delta\theta_k)} - \frac{\Delta\theta_k\psi_{0k}(i)\psi_{0k}(j)}{\theta_{0k}(\theta_{0k}+\Delta\theta_k)}\right)\right]$$

The sensitivity of the electrical potential $V_i$ of the node i to the admittance variation of the branch of the network 2 located between the nodes u and v therefore verifies the following equation (Eq.5):

$$\frac{\partial V_i}{\partial y_{uv}} = \sum_{j=1}^{n} I_j\left[\sum_{k=2}^{n}\left(\frac{\theta_{0k}\frac{\partial\psi_k(i)}{\partial y_{uv}}\psi_{0k}(j)+\theta_{0k}\frac{\partial\psi_k(j)}{\partial y_{uv}}\psi_{0k}(i) - \frac{\partial\theta_k}{\partial y_{uv}}\psi_{0k}(i)\psi_{0k}(j)}{\left(\theta_{0k}+\Delta y_{uv}\frac{\partial\theta_k}{\partial y_{uv}}\right)^2}\right)\right]$$

From this equation, the sensitivity of the voltage between the source S and the load C (in other words the sensitivity of the voltage drop measured between these two nodes) to the variation of admittance of a branch of the network can be easily calculated by the 3C estimation module from the relationship:

$$\frac{\partial V_{SC}}{\partial y_{uv}} = \frac{\partial V_s}{\partial y_{uv}} - \frac{\partial V_c}{\partial y_{uv}}$$

in which the sensitivities of the electrical potentials $V_S$ and $V_C$ are evaluated by the second estimation module 3C from the equation (Eq. 5) indicated above applied to the source node S and to the load node C, and the sensitivities of the eigenvectors and eigenvalues of the matrix L are calculated from the equations (Eq.3) and (Eq.4).

The estimation module 3C can be configured to calculate the sensitivity of the voltage to a variation in admittance of each branch of the graph G. As a variant, it can be assumed that only the electromechanical junctions are likely to strongly affect the connectivity of the network (for example due to a loose bolt, a degradation of the contact ensured by the junction) in order to limit the calculations: the 3C estimation module can in this case be limited to the variations in the admittances (i.e. contact resistances) of the branches representing these electromechanical junctions, the other admittances being kept fixed equal to their initial values. It should be noted that the degradation of the other elements of the network corresponds to a structural degradation which can be detected by other means.

From the sensitivities estimated by the estimation module 3C, the 3D determination module of the identification device 3 is able to determine (i.e. to identify) the critical elements of the network 2 for at least one source-load pair connected to the network (step E40). More specifically, an element of the network 2 is identified as critical by the 3D determination module when the sensitivity of the voltage $V_{SC}$ between the considered source S and load to the disturbance $\Delta y_{uv}$ applied to the value of the admittance of this critical element (that is to say here to the branch of the graph representing this element) exceeds a predetermined criticality threshold THR. In relation to the operational criterion considered by the monitoring system, the criticality threshold THR is taken here equal to 2% of the maximum allowable voltage drop between the electrical source and the load. Thus, all the network elements for which the sensitivity of the voltage $V_{SC}$ exceeds the criticality threshold THR are considered to be critical by the 3D determination module. In the embodiment described here, the other network elements modeled by a branch are considered to be fixed and their admittances are taken equal to their initial value (value considered in the Laplacian matrix L0 before disturbance).

The monitoring of the state of the electrical network 2 can therefore focus on the elements of the network identified as critical in step E40, for each electrical source and each load of the airplane connected to the electrical network 2. It is noted that the identification method operates regardless of the criticality threshold THR chosen. The choice of this criticality threshold impacts the compromise between the accuracy of the results obtained and the speed of execution of the monitoring method. Thus, a criticality threshold taken equal to 0 imposes taking into account, during monitoring, all the elements of the electrical network 2.

Figure 5:
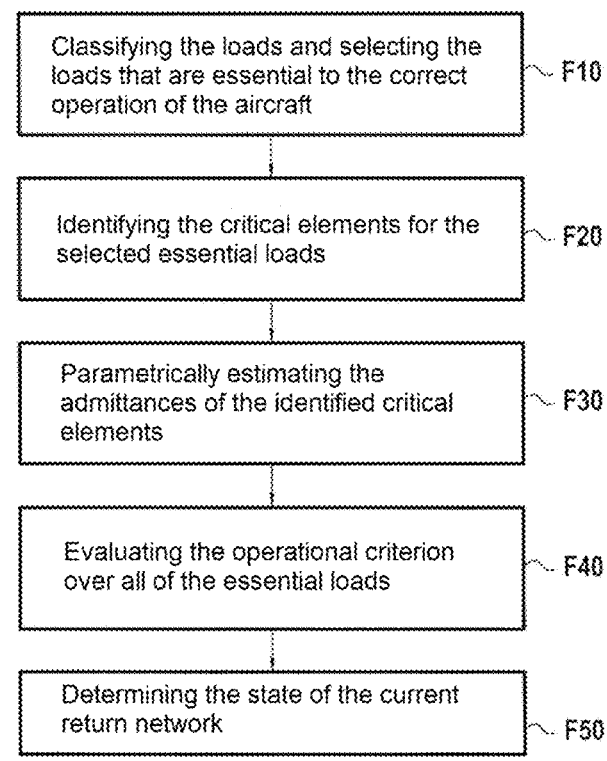
FIG. 5 represents the main steps of a monitoring method according to the invention, implemented by the monitoring system of FIG. 1.

FIG. 5 represents, in a particular embodiment, the main steps implemented during this monitoring by the monitoring system 1. These steps correspond to the steps of the monitoring method according to the invention.

The monitoring proposed by the invention comprises, in addition to the identification of the critical elements of the network to be monitored, several steps which aim at verifying the connectivity of the loads of the airplane and the compliance with the operational criterion according to which the voltage drops observed between the different loads and the different sources of the airplane are less than a maximum allowable voltage drop set here to 0.5 V.

In the embodiment described here, to simplify the monitoring of the electrical network 2, there is considered a preliminary step of classifying the various electrical loads of the airplane connected to the electrical network 2 according to their importance with regard to the operation of the airplane. This step is intended to determine the loads connected to the electrical network 2 that are critical, that is to say determining or even essential to the correct operation of the airplane. This classification can be established from information provided by the main system manufacturer or aeronautical integrator. It allows the monitoring system 1 to select, among the plurality of loads of the airplane that are connected to the electrical network, a reduced number of loads to be taken into account when monitoring the electrical network (step F10). More specifically, only the most decisive loads designated below by "essential" with regard to the correct operation of the airplane are selected by the monitoring system 1. This makes it possible to limit the complexity of implementation of the monitoring, that being conducted only with regard to the selected loads.

From the essential loads selected, the monitoring system 1 identifies, via the identification device 3, for each source S—load C pair comprising an essential load, the critical elements of the electrical network 2 to be considered (step F20). This identification is carried out by applying to the source S and to each load C the identification method according to the invention, previously described with reference to FIG. 2. It should be noted that elements of the network can be critical for separate essential loads.

The monitoring system 1, via its parametric estimation module 6, then estimates the value of the admittance of each critical element identified by the identification device 3 for the different source-load pairs considered (step F30).

To this end, the parametric estimation module 6 uses a numerical model MOD modelling the electrical behavior of the electrical network 2 as a function of the admittance of its elements, and electrical measurements performed by means of the sensors 4 making it possible to evaluate the behavior of the electrical network 2 and compare it to the behavior modeled by the numerical model.

In the embodiment described here, the numerical model MOD considered by the parametric estimation module 5 to represent the behavior of the electrical network as a function of the admittances of its elements is the same model as the one used by the identification device, namely that in the network 2, the nodal electric potentials $\underline{V}$ are linked to the nodal currents via the admittances of the branches of the graph, according to the relationship:

$$Y\underline{V}=\underline{I} \quad \text{(MOD)}$$

where Y designates the matrix of the admittances of the branches of the graph (in other words of the elements of the network), this matrix being identical to the Laplacian matrix. This model defines the circuit equations of the electrical network 2.

Figure 6:
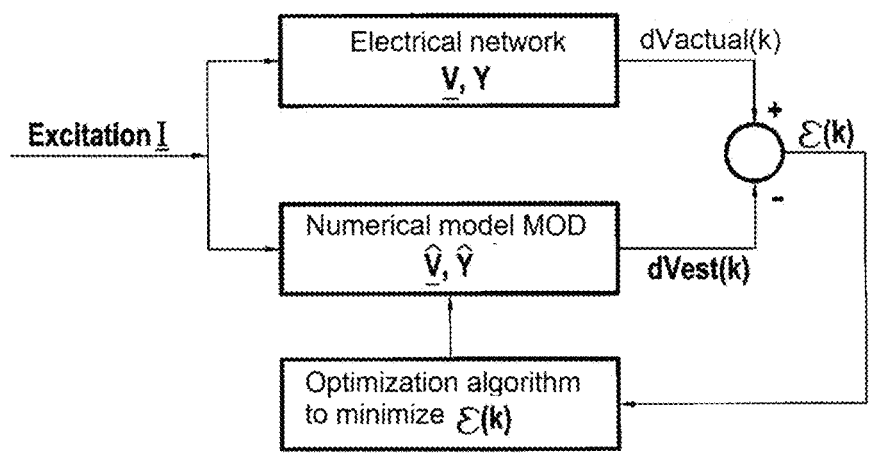
FIG. 6 represents an example of a parametric estimation technique implemented during the monitoring method.

The parametric estimation aims at determining the components of the matrix Y via an iterative technique. This technique is illustrated in FIG. 6. It generally consists in exciting the electrical network 2 by means of continuous nodal currents (in one or more configurations), and in measuring the voltage drops resulting from the excitation of the electrical network by means of sensors duly positioned in the electrical network 2. The voltage drops corresponding to the considered excitation currents are also estimated by means of the numerical model MOD, and compared with the measured voltage drops. The admittances are estimated by minimizing the difference observed between the voltage drops estimated and measured by means of an optimization algorithm. This optimization can possibly be repeated during a plurality of iterations to allow the estimation of all the admittances of the critical elements, the admittances determined during an iteration being considered to be known in the following iteration.

The parametric estimation technique implemented by the estimation module 5 is therefore based on electrical measurements (e.g. measurements of potentials, voltage drops and/or currents as detailed later) performed by means of the sensors 4 within the electrical network 2. The positioning of the sensors 4 to perform these measurements is an important parameter to be taken into account which impacts both the complexity of the monitoring method and its accuracy.

To determine (and optimize) the locations of the sensors 4, the inventors have considered that the more the measured voltage drop is affected by a critical element of the network (in other words by a branch of the graph), the more the information obtained through the measurement of this voltage drop is useful for estimating the admittance of this critical element. They therefore decided on the location of the sensors 4 as a function of the voltages (or currents) affected by one or more critical elements identified in step F20.

It should be noted that the number of sensors 4 to be placed in the electrical network 2 also results from a compromise between complexity and accuracy of the implemented monitoring: indeed, a small number of sensors provides a small number of measurements, which results in a time saving in maintenance of the electrical network 2; conversely, a large number of sensors providing a large number of measurements makes it possible to improve the accuracy of the estimation of the admittances of the critical elements.

In the embodiment described here, it is chosen to use as many sensors as critical elements identified in the electrical network 2 in step F30. For each admittance to be estimated, the path most affected between the source S and the load C by the disturbances applied to this admittance is identified in the electrical network 2. This path can comprise one or more elements of the network (e.g. structural elements, segments of structural elements and other connection conducting elements), and is therefore represented in the graph by one or more branches. It can be determined by means of a method similar to the one used to identify the critical elements of the electrical network 2, that is to say by taking into account the sensitivities of the voltages to the disturbances applied to the admittances of the elements of the network between the two nodes, these sensitivities being evaluated from the equation (Eq. 5) and the equations reflecting the sensitivity of the eigenvalues and eigenvectors of the Laplacian matrix L of the graph.

In this embodiment, the sensitivity is determined over all of the possible source S—loads C paths, but it is also possible, considering that some elements of the electrical network 2 may be inaccessible or hardly accessible, to determine the sensitivities of the accessible measurements and determine the best measurements responding to the need.

It should be noted that in the example mentioned here, attention is given to the sensitivities of the voltages at the ends of the paths and voltage measurements are performed by means of the sensors 4. As a variant, it is possible to consider branch current measurements or voltage drop measurements and branch current measurements.

The sensors 4 are placed at the ends of each path identified for each critical element of the network 2.

It is further noted that in order to obtain measurements which are relevant for the estimation of the admittances of the critical elements, it is preferable to make sure that during the excitation of the electrical network to perform the measurements by the sensors 4, the critical elements of the network are traversed by a current. Points of injection of the excitation currents will therefore be chosen accordingly. Several configurations (for example an integer K greater than 1) can be considered for this purpose. This choice can be made from the design of the electrical network 2 and remains fixed.

Once the sensors 4 are duly placed in the electrical network, the parametric estimation of the admittances of the critical elements carried out by the parametric estimation module 5 is implemented in the following manner, based on the representation by the complex graph G of the electrical network 2.

More specifically, in accordance with the numerical model MOD used by the parametric estimation module 5, the nodal potentials and the nodal currents are linked by the following system of equations (Eq.6):

$$\begin{cases} M_{inc} * W * M_{inc}^t * \underline{V} = \underline{I} \\ \underline{dV} = C_{mes} * \underline{V} \end{cases} \quad \text{Eq. 6)}$$

where:

$M_{inc}$ designates the incidence matrix of the complex graph G. This matrix reflects the interconnections between the elements of the electrical network 2, in other words between the branches of the complex graph G representing these elements;

$\underline{W}$ is the matrix of the weights of the graph G; it concerns a diagonal matrix in which each element represents the admittance of a branch of the network. It is noted that according to the critical elements identified during step F30, all or part of the recorded admittances are to be estimated, the others being assumed to be known;

$\underline{V}$ is a vector representing the nodal potentials;

$\underline{I}$ is a vector representing the nodal currents injected for the measurement;

$\underline{dV}$ designates a vector containing the voltage drops measured by the sensors 4; and $C_{mes}$ designates the matrix called combination matrix, representing the incidence matrix of the measurements; the number of columns in this matrix is equal to the number of performed measurements, while the number of rows is equal to the dimension n of the graph G. The matrix $C_{mes}$ is constructed in a way similar to the incidence matrix except that it no longer describes a branch between two neighboring nodes, but a path (which is the measured voltage drop) between 2 non-neighboring nodes.

By way of illustration, to better understand the construction of this matrix, an example is considered, based on the network EX2 illustrated in FIG. 4A and modeled by the graph G(EX2) in FIG. 4B (for a point of injection of the excitation current located at node 11 and an output of the current at node 15). It is assumed that three measurements of voltage drops are performed between the nodes 6 and 9, between the nodes 15 and 24 and between the nodes 3 and 9 respectively. The matrix of the combinations resulting therefrom is given by:

$$C_{mes} = \begin{pmatrix} 0 & 0 & 0 \\ 0 & 0 & 0 \\ 0 & 0 & 1 \\ 0 & 0 & 0 \\ 0 & 0 & 0 \\ 1 & 0 & 0 \\ 0 & 0 & 0 \\ 0 & 0 & 0 \\ -1 & 0 & -1 \\ 0 & 0 & 0 \\ 0 & 0 & 0 \\ 0 & 0 & 0 \\ 0 & 0 & 0 \\ 0 & 0 & 0 \\ 0 & 1 & 0 \\ 0 & 0 & 0 \\ 0 & 0 & 0 \\ 0 & 0 & 0 \\ 0 & 0 & 0 \\ 0 & 0 & 0 \\ 0 & 0 & 0 \\ 0 & 0 & 0 \\ 0 & -1 & 0 \\ 0 & 0 & 0 \end{pmatrix}$$

The system of equations (Eq.6) can be written in an equivalent manner in the form:

$$\begin{cases} 0 = f(\underline{V}, \underline{W}, \underline{I}) \\ \underline{dV} = g(\underline{V}, \underline{W}, \underline{I}) \end{cases}$$

where f designates a non-linear function and g designates a linear function.

K designates the number of sets of experimental measurements performed on the electrical network 2 by means of the sensors 4 during the same iteration: each set of measurements corresponds for example to a point of injection of the current into the different network, and comprises the measurements performed by the various sensors 4 associated with each critical element of the network.

The parametric estimation carried out by the estimation module 5 then consists in estimating the admittances of the critical elements best corresponding to the K sets of measurements performed.

In the following, $\underline{West}$ designates the estimation of the matrix of the weights of the elements of the network 2: this matrix comprises the estimated admittances of the critical elements and the known admittances of the other elements of the network 2. The parametric estimation module 5 estimates, from the estimation $\underline{West}$, admittances of the elements of the network 2 and using the system of equations (Eq.6), the vector $\underline{dVest}$ of the voltage drops observed in the electrical network 2 for each set of measurements. This vector verifies the following equations:

$$\begin{cases} 0 = f(\underline{V_{est}}, \underline{W_{est}}, \underline{I}) \\ \underline{dV} = g(\underline{V_{est}}, \underline{W_{est}}, \underline{I}) \end{cases}$$

Then it calculates, for each set of measurements indexed by k, k=1, ..., K, the estimation error denoted εk between the actual voltage drops denoted $\underline{dV_{actual_k}}$ measured on the network and the estimated voltage drops $\underline{dV_{est_k}}$, namely:

$$\varepsilon_k = dV_{actual_k} - dV_{est_k}(\underline{V_{est}})$$

The optimal $\underline{West}$ value is then obtained by the parametric estimation module 5 by minimizing the quadratic error between the actual and estimated voltage drops over all of the K sets of measurements performed, namely:

$$\min_{\underline{Y}} \sum_k^K \varepsilon_k^2 = \min_{\underline{Y}} \sum_k^K (dV_{actual_k} - dV_{est_k}(\underline{V_{est}}))^2$$

The parametric estimation module 5 also considers, for the minimization, a physical constraint imposing that the admittances are positive.

The parametric estimation implemented by the parametric estimation module 5 amounts to solving an optimization problem whose formulation is explained below:

$$\min \sum_k^K (dV_{actual_k} - dV_{est_k}(\underline{V_{est}}))^2$$

with $M_{inc} * W_{est} * M_{inc}^t * \underline{V_{est}} = \underline{I}$ $w_i \geq 0$ To achieve this optimization, the parametric estimation module 5 may resort to different optimization techniques. In the embodiment described here, given the number of variables to be estimated (voltage drops and admittances of the critical elements, the others being assumed to be known), the parametric estimation module 5 uses an algorithm of the internal points, known to those skilled in the art and not detailed here. This algorithm is described for example in the article by Wachter et Biegler entitled "On the implementation of an interior-point filter line-search algorithm for large-scale non-linear programming", 2006.

The parametric estimation module 5 can also use the algorithm of the interior points in combination with a strategy making it possible to avoid convergence of the algorithm towards local minima. Such a strategy can consist, for example, of applying the algorithm several times by modifying its starting point (i.e. the initial values of the admittances of the branches of the critical contacts).

Other algorithms with the same properties can be used as a variant by the parametric estimation module 5, such as the Levenberg-Marquardt algorithm.

In another embodiment of the invention, the parametric estimation module 5 estimates the admittances of the critical elements from measurements of voltage drops $dV_{actual}$ and from measurements of current $i_{actual}$. In this case, the optimization problem to be solved by the parametric estimation module 5 is written:

$$\min \sum_k^K (dV_{actual_k} - dV_{est_k}(\underline{V_{est}}))^2 + \sum_j^J (i_{actual_j} - i_{est_j}(\underline{V_{est}}, \underline{Y}))^2$$

with $M_{inc} * W_{est} * M_{inc}^t * \underline{V_{est}} = \underline{I}$ $w_i \geq 0$ To carry out this parametric estimation, the parametric estimation module 5 must not only estimate the voltage drops $dV_{est}$ and the weights of the branches W but also the nodal currents $i_{est}$.

It is noted that the parametric estimation module 5 can implement an iterative parametric estimation technique (by repeating the steps described above), in particular to guarantee that all the critical elements whose admittance must be estimated are indeed traversed by a current when performing the measurements, and the estimated admittances are reliable. Each iteration can correspond to a separate point of injection of the current on the network 2 to perform the measurements so as to allow the estimation of all the admittances. The admittance values estimated during an iteration are preferably fixed and considered to be known in the following iteration.

Furthermore, it should be noted that the parametric estimation which has just been described can also be used to determine the admittances of the non-critical elements of the network 2 during a preliminary step. These admittances require a single determination since they are then considered to be invariant during the monitoring method. To carry out this determination, it suffices to consider that all the admittances of the matrix $L_{est}$ must be determined (it may therefore be necessary to consider a larger number of sensors to perform measurements relevant to all of the elements of the network). Tests conducted by the inventors on simple networks using this methodology have shown that values very close to the exact values of the admittances can be obtained easily.

The estimation of the admittances of the critical elements of the network 2 carried out by the estimation module 5 then allows the evaluation module 6 of the monitoring system 1 to evaluate over all of the source-load C pairs considered, an operational criterion of the predefined network representative of the operation of the network (step F40). In the embodiment described here, the operational criterion evaluated is the maximum voltage drop between each load C and the source S, in order to determine whether this maximum voltage drop complies with the maximum voltage drop authorized by the regulations of 0.5 V.

To evaluate this operational criterion, the evaluation module 6 defines an estimated model of the electrical network from an estimated Laplacian matrix Lest.

It should be noted that this model provides an estimate of the influencing parameters of the network (i.e. of the admittances of the critical elements of the network) on the voltage drops between each source and each essential load but does not guarantee the values of the admittances of the other elements of the network. A degraded model of the entire network can be produced by estimating all of the admittances of the network elements; such an estimate however requires the installation of a large number of sensors 4 in the network 2 in order to have the measurements necessary for this estimation. This approach can also be used for the initial estimation of the admittances of the elements of the current return network 2 (and more particularly of the admittances or contact resistances corresponding to the electromechanical junctions which create contact resistances) since the values of these admittances are not known (the values of the admittances of the structural elements can be obtained from the main system manufacturer or aeronautical integrator). The initial characterization of the contact resistances (or more generally of the admittances of the network 2) can thus be implemented by repeating steps F10, F20, F30 (applied several times) and a step of validating the estimated admittances by comparing the source-load voltage drops estimated via the model derived from the admittances estimated at the measured source-load voltage drops.

Then, from the current injected into the network 2 by each essential load C considered during the normal operation of the airplane (this current is known to the specifications of the integrator or can be easily measured), the evaluation module 6 evaluates the drops of voltages between the source S and each essential load C thanks to the following operational equation integrating the circuit equations:

$$L_{est} * \underline{V} = \underline{I_{fct}}$$

where V designates in this operational equation the vector of the nodal potentials in operation, and $I_{fct}$ designates the vector of the nodal currents injected by the essential loads.

Since the Laplacian matrix $L_{est}$ of a graph is not invertible, the nodal potentials are calculated by multiplying the vector of the nodal currents by the Moore-Penrose pseudo-inverse of the Laplacian matrix $L_{est}$. The voltage drop between each source and each essential load can then be obtained from the estimated nodal potentials (difference of the potentials between the source S and each essential load C) and is compared by the evaluation module 6 with the threshold 0.5 V.

The monitoring system 1 is then able, from the operational criteria evaluated for each source-load pair considered, to determine the operating state of the electrical network 2 (step F50).

If all the voltage drops observed between all the source-load pairs considered (that is to say comprising the loads "essential" to the correct operation of the airplane determined in step F10) are less than 0.5 V, then the state (of operation) of the current return electrical network 2 is considered by the determination module 7 of the monitoring system 1 to be satisfactory or normal.

Otherwise, the determination module 7 determines that the electrical network 2 is in a degraded or faulty state and requires maintenance. The degraded elements of the network can be easily detected and located in the light of the different quantities evaluated during steps F20 to F40 and of the critical elements identified, which makes it possible to consider a maintenance, a repair or a replacement of these elements and to anticipate a larger malfunction of the current return network.

In the embodiment described here, the operational criterion evaluated to determine the state of the current return network is the maximum voltage drop between the sources and the loads of the airplane. However, other operational criteria may be considered, as a replacement therefor or in addition thereto. For example, it is also possible to consider as an operational criterion a maximum variation value observed between the estimated admittance for a critical element and a nominal value of this admittance (or of any other electrical characteristic of the element), the state of the electrical network being determined as faulty if for at least one critical element of the network for at least one source-load pair considered, this maximum variation is greater than a predetermined alert threshold (for example 50%). The nominal (or initial) values of the admittances can be known, or can be determined via a parametric estimate as described in step F40.

The invention thus allows easily monitoring the operating state of a current return electrical network.

Figure 7:
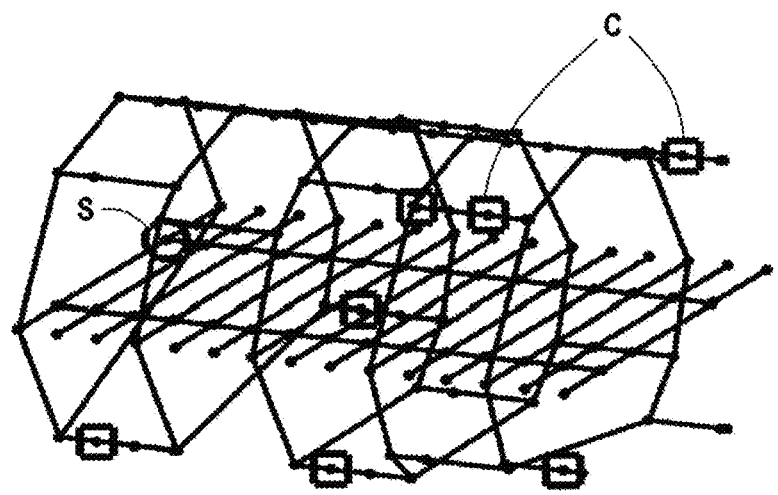
FIGS. 7 to 9 illustrate an example of application of the invention.

An example of application of the invention will now be briefly described by way of illustration. The current return network modeled in FIG. 7 is considered here. In this figure, the source node is represented by a circle and the load nodes (7 in number) are represented by squares. It is noted that most of the nodes represented in FIG. 6 that model a contact between two structural elements of the network in fact "hide" two nodes of the graph because of the contact established between the structural elements by means of junctions (but that do not appear in perspective in the mode of representation adopted in this figure).

In this example, it is assumed that only the contact admittances can be degraded, the admittances of the other elements of the network being considered to be fixed and known. In addition, the initial values of the contact admittances are assumed to be known. It is also assumed that the contact admittances can decrease by a maximum of 70% from their initial value (in other words, the contact resistances can vary between their initial value and 333% of this value).

In the example considered here, it is considered that the graph modelling the current return network illustrated in FIG. 7 comprises 244 nodes and 284 admittances. For the sake of simplification, the nodes of the graph are numbered in the remainder of the description.

As indicated above, 7 separate loads located respectively at nodes 108, 109, 112, 114, 119, 127 and 136 are considered, which inject an identical current of 100 A into the current return network. The (power) source is for its part located at node 212. The voltage drops between the source and the loads in normal operation (i.e. when the network is in a satisfactory state) are given below in the Table 1). It is noted that the current return network is well dimensioned because the operational criterion is met for all the loads (voltage drops between the source and the loads less than 0.5 V).

TABLE 1

| | Voltage drops between the source and the loads during normal operation | | | | | | |
|---|---|---|---|---|---|---|---|
| | Load 1 (node 108) | Load 2 (node 109) | Load 3 (node 112) | Load 4 (node 114) | Load 5 (node 119) | Load 6 (node 127) | Load 7 (node 136) |
| Voltage drop (V) | .4014 | .3709 | .3657 | .2768 | .2092 | .2415 | .3955 |

In the example considered here, it is assumed that a preliminary classification of the loads so as to identify the loads that are essential to the correct operation of the airplane is implemented (cf. step F10 previously described), and that only the loads located at nodes 112, 127 and 136 are considered to be essential. In other words, only the voltage drops relating to these loads are monitored.

In application of the monitoring method according to the invention, the critical elements of the network are identified between each source-load pair considered. To this end, as detailed in step F20, the matrices of sensitivity of each voltage drop between the source and a load to the variations in the admittances are evaluated thanks to the disturbing study of the spectrum of the graph. The sensitivities are calculated only for the admittances of the contacts since the admittances of the other branches of the network are considered to be fixed. In this example, the criticality threshold is set to −2% of modification of the voltage drops.

Figure 8A:
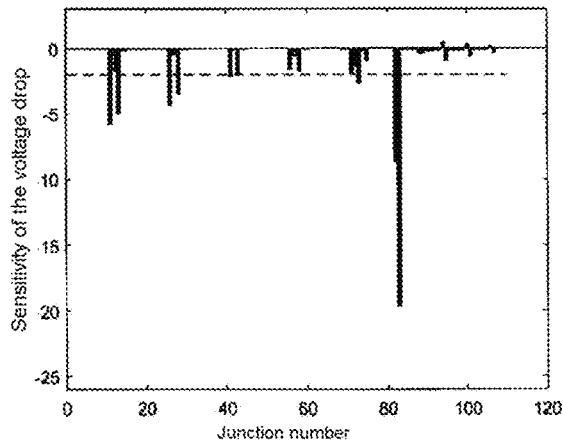
Figure 8B:
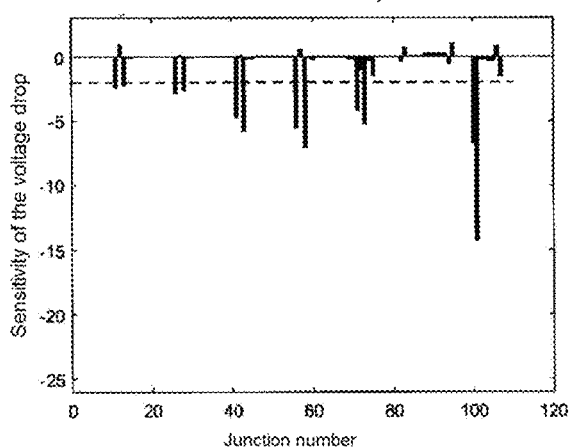
Figure 8C:
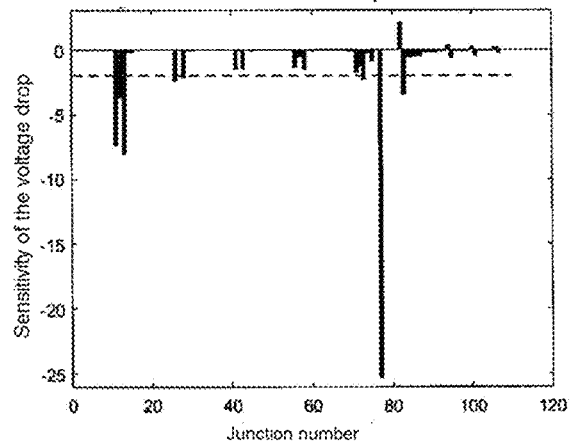

The sensitivities of the voltage drops are calculated and given in FIG. 8, for the different loads considered.

It can be noted in this figure that for the voltage drop between the source and the load 3, there are 9 critical branches whose sensitivity is less than ~2%. This means that if one of the contact admittances corresponding to these 9 critical branches decreases by 100% then the voltage drop between the source and the load would increase by more than 2%.

For the voltage drop between the source and the load 6, there are 12 critical branches and for the voltage drop between the source and the load 7 there are 8 critical branches.

However, it should be noted that some critical branches are common to the voltage drops observed for the three loads. It is therefore possible to be limited to the monitoring at only 16 critical branches to monitor the voltage drops at the terminals of the 3 essential loads. The 16 critical branches (i.e. critical elements of the network) to be monitored are the contacts corresponding to the nodes 11, 12, 13, 26, 28, 41, 43, 56, 58, 71, 73, 77, 82, 83, 100 and 101. In the following, the other contact admittances are considered to be fixed and equal to their initial value (even if in the actual network, these admittances may be brought to vary).

The branches corresponding to the critical elements to be monitored (hereinafter designated by "critical branches") are now known and it is now necessary to determine the electrical measurements which must be performed in the network to provide the right information to the parametric estimation.

Figure 9:
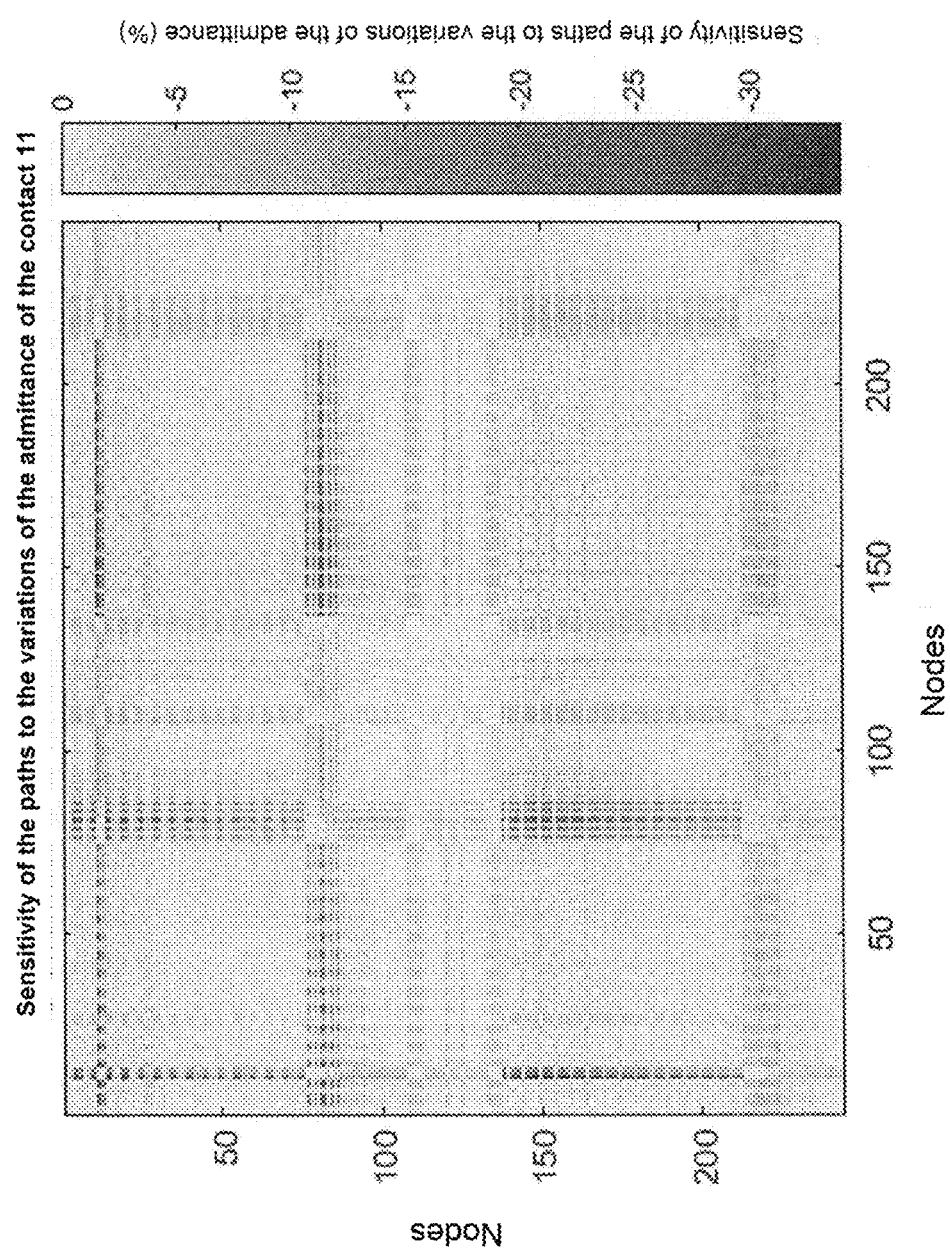

For this, the sensitivity matrices derived from the disturbing study of the spectrum of the graph (step F20 and E40) are used again. The network paths most affected by the critical branches are sought thanks to these matrices. It is assumed here that a voltage drop measurement is performed for each critical branch. FIG. 9 gives a graphic representation of the matrix of sensitivity of the paths of the network to the variation of the admittance of the 1st critical branch corresponding to the node 11. It is noted that the path between the nodes 11 and 148 is the path most affected by the contact. It can be noted that this path corresponds to the path between the terminals of the contact 11 because the modification of the admittance of the contact first modifies the voltage drop thereof. For all the other critical branches, the most affected paths are also the paths between the ends of the branches corresponding to the critical elements. The sensors are therefore placed at the terminals of the critical contacts in order to perform 16 voltage drop measurements.

In addition, to guarantee the excitation of the critical branches, current injections are made between their terminals.

It is noted that it is not always possible to install sensors at the terminals of the contacts since the structure of the airplane does not allow access to all the elements of the network during maintenances. In this case, technical constraints can be added to the sensitivity matrices in order to take into account only the accessible nodes (this can affect the selection of the path most affected by each critical branch).

Once the sensors are placed, the 16 voltage measurements are performed. In the example considered here, these measurements are performed from a numerical simulation in which the admittances of the contacts are degraded, their admittances have been chosen randomly between half of their initial value and their initial value.

The parametric estimation described in step F30 is then carried out. It concerns minimizing the quadratic error between the measurements on the network and the voltage drops obtained by estimation of the admittances of the critical branches. Due to the identification of the critical elements carried out, the other contact admittances are considered to be equal to their initial value in the optimization. The optimization problem is solved 15 times with different initial points in order to avoid convergence towards a local minimum.

The quadratic error obtained between the 16 voltage drops measured on the actual network and those estimated is of $3.08*10^{-7}$. This solution is on average obtained after 95 iterations in 1 min and 15 seconds. The estimates of the admittances of the critical branches as well as the errors with the actual admittances are given in Table 2 reproduced below:

TABLE 2

Comparison between the estimated and actual admittances of the 16 critical branches.

| | Estimated admittance ($\Omega^{-1}$) | Admittance of the actual system ($\Omega^{-1}$) | Estimation Error (%) |
| --- | --- | --- | --- |
| Contact 11 | 645.2 | 640.9 | 0.66 |
| Contact 12 | 922.6 | 983.7 | −6.21 |
| Contact 13 | 317.2 | 315.7 | 0.46 |
| Contact 26 | 453.4 | 463.3 | −2.15 |
| Contact 28 | 614.9 | 623.3 | −1.34 |
| Contact 41 | 614.2 | 611.7 | 0.41 |
| Contact 43 | 526.2 | 522.9 | 0.64 |
| Contact 56 | 509.0 | 508.2 | 0.16 |
| Contact 58 | 640.3 | 639.5 | 0.13 |
| Contact 71 | 628.1 | 625.2 | 0.47 |
| Contact 73 | 642.9 | 640.6 | 0.36 |
| Contact 77 | 370.2 | 370.2 | 0.00 |
| Contact 82 | 835.1 | 823.3 | 1.44 |
| Contact 83 | 974.3 | 990.0 | −1.58 |
| Contact 100 | 621.6 | 622.1 | −0.09 |
| Contact 101 | 890.8 | 890.2 | 0.07 |

It appears in this table that the quadratic error is very small. The estimated admittances are relevant for reconstructing the voltage drops measured on the actual degraded system. It should also be noted that the locations of the sensors are well defined since the minimization of the quadratic error makes it possible to obtain a good estimate of the admittances of the network. It is however noted that the estimate of the node 12 is slightly worse with an error of −6.21%. This can be explained by the uncertainty existing on the admittances of the non-critical elements (and more particularly of the contacts) of the network. To improve this estimate, another criticality threshold can be considered in order to take into account a larger number of critical elements.

The parametric estimate therefore allowed correctly estimating the admittances of the critical elements of the network.

In order to verify the operational criterion of voltage drop between the source and the essential loads, the estimated model of the degraded network is constructed from the critical contact admittances estimated during the parametric estimation. The admittances of the non-critical contacts and of the other elements are equal to their initial value.

The potentials of the set of the nodes in the current return network during its normal operation are estimated by means of the operational model:

$$\underline{V}_{est} = L_{est}^{*} * \underline{I}_{fct}$$

Table 3 reproduced below reports the estimated voltage drops between the source and the 3 essential loads:

TABLE 3

Comparison between estimated and actual voltage drops of the degraded network

|  | Estimated voltage drop (V) | voltage drop of the actual system (V) | Estimation error (%) |
| --- | --- | --- | --- |
| Load 3 | 0.3957 | 0.4001 | −1.1 |
| Load 6 | 0.2684 | 0.2704 | −0.7 |
| Load 7 | 0.5931 | 0.5969 | −0.6 |

According to the estimates of the critical branch admittances, the current return network is operational for the 3 essential loads. However, the voltage drops of the loads 3 and 7 are close to the limit of 0.5 V. The actual voltage drops allow the same conclusion. For the essential loads, the maximum estimation error recorded is of 1.1%, which remains extremely accurate.

This example clearly shows that the monitoring proposed by the invention makes it possible to obtain a good approximation of the evolution of the voltage drops between the source and the essential loads during the degradation of the current return network. The accuracy of the estimate can be improved by lowering the criticality threshold and therefore by estimating more critical branches.

The invention claimed is:

1. A method for identifying critical elements of a meshed current return electrical network of an aircraft, said aircraft comprising at least one structure made of composite material, said electrical network comprising a plurality of conductive elements, said identification method comprising:
   a step of modelling the electrical network by means of a graph comprising a plurality of nodes and a plurality of branches connecting these nodes, each node of the graph corresponding to a connection point between two elements of the network, each branch between two nodes representing an element of the network, said graph being represented by a matrix reflecting the topology of the network and comprising values of an electrical characteristic of the elements of the network represented by the branches of the graph;
   a step of determining eigenvalues and eigenvectors of the matrix representing the graph;
   a step of estimating, from the eigenvectors and eigenvalues of the matrix, and for each element of a plurality of elements of the network represented by a branch of the graph, a sensitivity of a determined electrical property between a source and a load that are connected to the electrical network at a disturbance in the value of the electrical characteristic of this element; and
   a step of determining, among the elements of the network, critical elements with regard to a state of operation of the network, an element of the network being determined as critical when the sensitivity of the electrical property estimated for this element exceeds a predetermined criticality threshold.

2. The identification method according to claim 1 wherein:
   the electrical characteristic is an admittance of the element of the network;
   the matrix of the graph is a Laplacian matrix; and
   the electrical property is an electrical voltage between the source and the load.

3. A method for monitoring a meshed current return electrical network of an aircraft, said aircraft comprising at least one structure made of composite material, said electrical network comprising a plurality of conductive elements, said monitoring method comprising:
   a step of identifying at least one critical element of the network, for at least one source-load pair comprising a source and a load of the aircraft that are connected to the network, by using an identification method according to claim 1;
   a step of parametrically estimating a value of an electrical characteristic of each critical element, this step using a numerical model modelling an electrical behavior of the network as a function of said electrical characteristic and of the electrical measurements performed by means of sensors positioned in the network and making it possible to evaluate said electrical behavior, a sensor being positioned in the network for each critical element on at least one element of the network or on at least one path of the network formed by a plurality of elements of the network affected by a disturbance in the electrical characteristic of this critical element;
   a step of evaluating, for said at least one source-load pair, an operational criterion of the predefined network, this evaluation step using the value of the electrical characteristic estimated for each critical element; and
   a step of determining a state of the electrical network by taking into account the operational criterion evaluated for said at least one source-load pair.

4. The monitoring method according to claim 3 wherein the operational criterion evaluated is a maximum value of a voltage drop observed between each source and each load, the state of the electrical network being determined as satisfactory if this voltage drop is, for each source-load pair, less than said maximum value.

5. The monitoring method according to claim 3 wherein the operational criterion evaluated is a variation observed between the electrical characteristic estimated for a critical element and a nominal value of this electrical characteristic, the state of the electrical network being determined as faulty if for at least one critical element of the network for at least one source-load pair, this variation is greater than a predetermined alert threshold.

6. The monitoring method according to claim 3 further comprising a preliminary step of selecting, among a plurality of loads of the aircraft that are connected to the electrical network, at least one load considered to be essential with regard to the operation of the aircraft, the identification, parametric estimation and evaluation steps being applied only to the source-load pairs comprising said at least one selected essential load.

7. The monitoring method according to claim 3 wherein during the parametric estimation step, there are as many sensors used as identified critical elements, each sensor being associated with a critical element and placed on the network element or on the network path most affected by a disturbance in the value of the electrical characteristic of this critical element.

8. The monitoring method according to claim 3 wherein the parametric estimation step implements a technique of optimization known as technique of optimization of the interior points on a plurality of iterations.

9. The monitoring method according to claim 3 comprising a prior step of initially characterizing the electrical characteristics from the graph modelling the network, from the matrix representing the graph and from electrical measurements performed in the network.

10. A device for identifying critical connection points in a meshed current return electrical network of an aircraft, said aircraft comprising at least one structure made of composite material, said electrical network comprising a plurality of conductive elements, said identification device comprising:
   a modelling module configured to model the electrical network by means of a graph comprising a plurality of nodes and a plurality of branches connecting these nodes, each node of the graph corresponding to a connection point between two elements of the network, each branch between two nodes representing an element of the network, said graph being represented by a matrix reflecting the topology of the network and comprising values of an electrical characteristic of the elements of the network represented by the branches of the graph;
   a determination module configured to determine the eigenvalues and eigenvectors of the matrix representing the graph;
   an estimation module configured to estimate, from the eigenvectors and eigenvalues of the matrix, and for each element of the network represented by a branch of the graph, a sensitivity of an electrical property determined between a source and a load that are connected to the electrical network at a disturbance in the value of the electrical characteristic of this element; and
   a determination module configured to determine, among the elements of the network, critical elements with regard to an operating state of the network, an element being determined as critical when the sensitivity of the electrical property estimated for this element exceeds a predetermined criticality threshold.

11. A system for monitoring a meshed current return electrical network of an aircraft, said aircraft comprising at least one structure made of composite material, said electrical network comprising a plurality of conductive elements, said monitoring system comprising:
   an identification device according to claim 10 able to identify, for at least one source-load pair comprising a source and a load of the aircraft connected to the network, at least one critical element with regard to the operation of the network among the elements of the network;
   a plurality of sensors positioned in the network and able to perform electrical measurements;
   a parametric estimation module configured to estimate a value of the electrical characteristic of each critical element, this module using a numerical model modelling an electrical behavior of the network as a function of said electrical characteristic and of the electrical measurements performed by means said sensors and making it possible to evaluate the electrical behavior, a sensor being positioned in the network for each critical element on at least one element of the network or on at least one path of the network formed by a plurality of elements of the network affected by a disturbance in the electrical characteristic of this critical element;
   an evaluation module configured to evaluate, for said at least one source-load pair, an operational criterion of the predefined network, this module using the value of the electrical characteristic estimated for each critical element; and
   a determination module configured to determine an operating state of the electrical network by taking into account the operational criterion evaluated for said at least one source-load pair considered.

* * * * *